United States Patent
Yamauchi et al.

(10) Patent No.: US 9,269,576 B2
(45) Date of Patent: Feb. 23, 2016

(54) SILICON CARBIDE SEMICONDUCTOR SUBSTRATE AND METHOD FOR MANUFACTURING SAME

(71) Applicant: DENSO CORPORATION, Kariya, Aichi-pref. (JP)

(72) Inventors: Shouichi Yamauchi, Obu (JP); Naohiko Hirano, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/430,644

(22) PCT Filed: Sep. 12, 2013

(86) PCT No.: PCT/JP2013/005415
§ 371 (c)(1),
(2) Date: Mar. 24, 2015

(87) PCT Pub. No.: WO2014/054228
PCT Pub. Date: Apr. 10, 2014

(65) Prior Publication Data
US 2015/0228482 A1    Aug. 13, 2015

(30) Foreign Application Priority Data

Oct. 2, 2012 (JP) ................. 2012-220403

(51) Int. Cl.
| | |
|---|---|
| H01L 21/02 | (2006.01) |
| H01L 21/306 | (2006.01) |
| C30B 29/36 | (2006.01) |
| H01L 23/544 | (2006.01) |
| C30B 23/02 | (2006.01) |
| C30B 25/20 | (2006.01) |
| H01L 29/16 | (2006.01) |
| H01L 21/304 | (2006.01) |

(52) U.S. Cl.
CPC ........ *H01L 21/02656* (2013.01); *C30B 23/025* (2013.01); *C30B 25/20* (2013.01); *C30B 29/36* (2013.01); *H01L 21/02005* (2013.01); *H01L 21/02529* (2013.01); *H01L 21/02645* (2013.01); *H01L 21/304* (2013.01); *H01L 21/306* (2013.01); *H01L 23/544* (2013.01); *H01L 29/1608* (2013.01); *H01L 2223/54413* (2013.01); *H01L 2223/54433* (2013.01); *H01L 2223/54453* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 2003/0070611 A1 | 4/2003 | Nakamura et al. | |
| 2007/0159335 A1* | 7/2007 | Arai et al. | 340/572.8 |

FOREIGN PATENT DOCUMENTS

| | | |
|---|---|---|
| JP | 55-075221 A | 6/1980 |
| JP | 10-120497 A | 5/1998 |

OTHER PUBLICATIONS

International Search Report of the International Searching Authority mailed Oct. 22, 2013 for the corresponding International application No. PCT/JP2013/005415 (and English translation).
Written Opinion of the International Searching Authority mailed Oct. 22, 2013 for the corresponding international application No. PCT/JP2013/005415 (and English translation).
Office Action mailed Oct. 7, 2014 in a corresponding JP application No. 2012-220403 (and English translation).

* cited by examiner

*Primary Examiner* — Alexander Ghyka
(74) *Attorney, Agent, or Firm* — Posz Law Group, PLC; David Posz

(57) ABSTRACT

A silicon carbide semiconductor substrate is made of a silicon carbide single crystal and is formed with a stamp on at least a surface as an identification indication formed of a crystal defect. When a silicon carbide single crystal is allowed to grow using the silicon carbide semiconductor substrate as a seed crystal, the stamp can be propagated to the silicon carbide single crystal as a crystal defect. When silicon carbide semiconductor substrates are manufactured using the silicon carbide single crystal, the stamp has already been formed on each of the silicon carbide semiconductor substrates.

6 Claims, 3 Drawing Sheets

US 9,269,576 B2

SILICON CARBIDE SEMICONDUCTOR SUBSTRATE AND METHOD FOR MANUFACTURING SAME

CROSS REFERENCE TO RELATED APPLICATIONS

This disclosure is a U.S. national stage application of International Patent Application No. PCT/JP2013/005415 filed on Sep. 12, 2013 and is based on Japanese Patent Application No. 2012-220403 filed Oct. 2, 2012, the disclosures of which are incorporated herein by reference.

TECHNICAL FIELD

The present disclosure relates to an SiC semiconductor substrate (hereinafter referred to as "SiC wafer") manufactured from a seed crystal of silicon carbide (hereinafter referred to as "SiC"), and a method of manufacturing the same.

BACKGROUND

Conventionally, in SiC wafer production, a wafer quality is highly influenced by the quality of the seed crystal during crystal growth (for example, refer to PTL 1). For that reason, a high-quality seed crystal small in the number of crystal defects is important in producing high quality SiC wafers. Therefore, it is essential to strictly manage a high-quality seed crystal during processes and transport, and it is essential to provide a way to prevent a risk (stolen or lost) as high value-added products for the seed crystal that can manufacture the higher quality wafer. In addition, taking means (traceability) for identifying the seed crystal used in the process of manufacturing wafers circulating in the market is effective in prevention of the risk described above. For that reason, up to now, it is general to implement numbering for each wafer in a processing step during the wafer fabrication process, and the above risk is avoided by enabling a manufacturer to be found by numbering confirmation.

However, the numbering is intended to be implemented for identification of the wafer after processing on the wafer, and when crystal growth is performed with the use of the higher quality seed crystal to be subjected to risk avoidance, the history is not automatically imprinted on the wafer. Therefore, when the high-quality seed crystal is obtained by unauthorized means before imprinting, even if the wafer fabrication is conducted by performing crystal growth with the use of the seed crystal, it is impossible to determine whether the seed crystal has been used, or not, and the risk avoidance cannot be attempted. Also, when the SiC wafer cut out from an SiC single crystal grown from the seed crystal is obtained by unauthorized means before imprinting, even if the SiC wafer is newly used as the seed crystal and the wafer is fabricated by the crystal growth, the same as that described above is applied.

PATENT LITERATURE

PTL 1: Japanese Patent No. 3745668

SUMMARY

One object of the present disclosure is to provide a silicon carbide semiconductor substrate which can be confirmed to be used as a seed crystal when a silicon carbide single crystal is allowed to grow with the use of the silicon carbide semiconductor substrate as the seed crystal. Another object of the present disclosure is to provide a method of manufacturing a silicon carbide semiconductor substrate which can be confirmed to be used as a seed crystal when a silicon carbide single crystal is allowed to grow with the use of the silicon carbide semiconductor substrate as the seed crystal.

A silicon carbide semiconductor substrate according to one aspect of the present disclosure is made of a silicon carbide single crystal and is formed with a stamp on at least a surface as an identification indication formed of a crystal defect.

When a silicon carbide single crystal is allowed to grow using the silicon carbide semiconductor substrate as a seed crystal, the stamp can be propagated to the silicon carbide single crystal as a crystal defect. Accordingly, it can be confirmed that the silicon carbide semiconductor substrate is used as the seed crystal.

In a method of manufacturing a silicon carbide semiconductor substrate according to another aspect of the present disclosure, a seed crystal made of single crystal silicon carbide is prepared, and a stamp is formed on at least a surface of the seed crystal as an identification indication formed of a crystal defect. With the growth of the silicon carbide single crystal on the surface of the seed crystal on which the stamp is formed, the silicon carbide single crystal is allowed to grow while the stamp is propagated in a growth direction. The silicon carbide single crystal to which the stamp is propagated is cut out and sliced to form the silicon carbide semiconductor substrate formed with the stamp.

When a silicon carbide single crystal is allowed to grow using the silicon carbide semiconductor substrate as a seed crystal, the stamp can be propagated to the silicon carbide single crystal as a crystal defect. Accordingly, it can be confirmed that the silicon carbide semiconductor substrate is used as the seed crystal.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Hereinafter, embodiments of the present disclosure will be described with reference to the accompanying drawings. In the following respective embodiments, parts identical with or equivalent to each other are denoted by the same symbols for description.

First Embodiment

Figure 1:
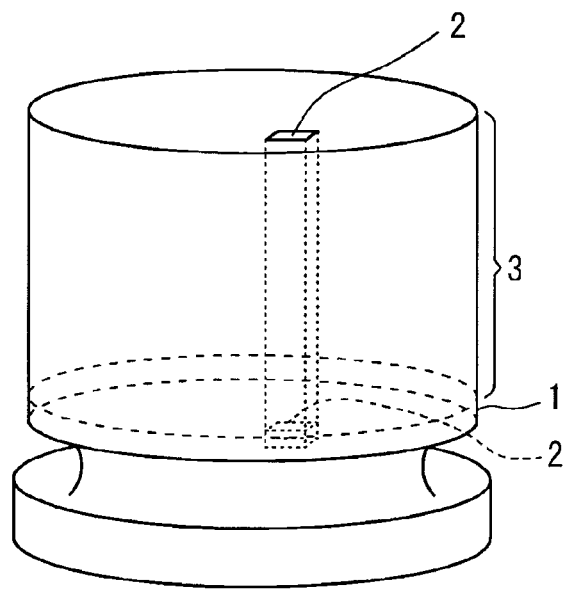
FIG. 1 is a perspective view illustrating a state in which an SiC single crystal is allowed to grow on a seed crystal according to a first embodiment of the present disclosure.

A first embodiment of the present disclosure will be described. As illustrated in FIG. 1, a seed crystal 1 made of a high-quality SiC wafer is prepared. As a method of forming the seed crystal 1 made of the high-quality SiC, any technique which is conventionally known may be used. Also, polymorphs of the seed crystal 1 to be prepared at this time may be any polymorphism such as 6H, 4H, or 3H, and a plane orientation may be any plane orientation such as an a-plane, an Si surface of a c-plane, or a C surface of a c-plane.

Then, a stamp (numbering) 2 is formed on a surface of the seed crystal 1 in advance. As the stamp 2, various identification indications that can be used for confirmation of a history, such as characters, numbers, bar codes, QR codes (registered trademark) can be used, and the stamp 2 can be formed of one or the combination of plural elements among them.

Figure 2A:
FIG. 2A is a diagram illustrating an example of an upper surface layout of a stamp.
Figure 2B:
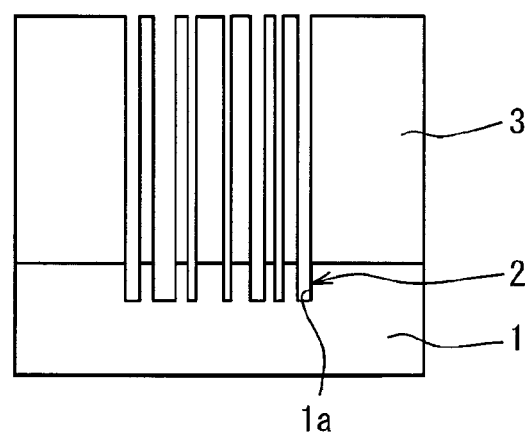
FIG. 2B is a cross-sectional view of the stamp along a line IIB-IIB of FIG. 2A.
Figure 3:
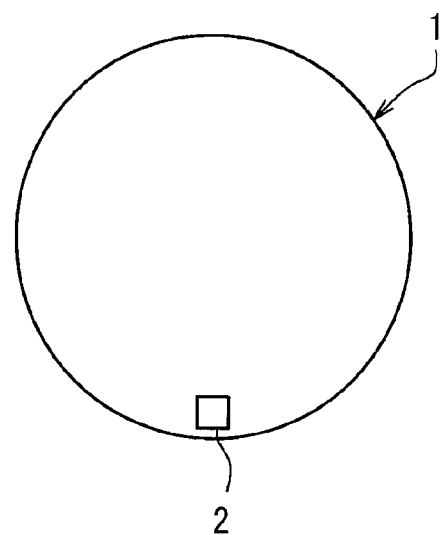
FIG. 3 is a diagram illustrating a location of the stamp in the seed crystal.

FIGS. 2A and 2B illustrate a case of forming the stamp 2, for example, with the use of a QR code as an identification indication, and the stamp 2 expressed as the identification indication of the QR code as illustrated in FIG. 2A can be formed of a step (concave portion) 1a on a surface of the seed crystal 1 as illustrated in FIG. 2B. The type of the stamp 2 may be a defect in the crystal such as a damage layer, in addition to the step 1a. For example, the stamp 2 formed of the step 1a or the damage layer can be formed by laser machining, cutting with a diamond cutting tool, or dry etching with masking portions other than the stamp 2. Also, the stamp 2 formed of the damage layer can be formed by ion implantation with masking portions other than the stamp 2. A formation position of the stamp 2 is not particularly limited, but, for example, as illustrated in FIG. 3, the stamp 2 can be provided at one position on an outer edge of the disc-shaped seed crystal 1.

As described above, with the formation of the stamp 2 on the surface of the seed crystal 1, even if the seed crystal 1 is lost by unauthorized means such as theft, the history of the seed crystal 1 can be confirmed with the stamp 2.

With the use of the seed crystal 1 in which the stamp 2 is formed as described above, as illustrated in FIG. 1, an SiC single crystal 3 is allowed to grow on the surface of the seed crystal 1. As a method of growing the SiC single crystal 3, any technique such as a sublimation recrystallization method or a gas supply method may be applied. Accordingly, the SiC single crystal 3 that inherits the crystallinity of the surface of the seed crystal 1 can grow.

Therefore, when the SiC single crystal 3 is allowed to grow on the surface of the seed crystal 1 in which the stamp 2 is formed, a through defect (a micropipe or a through screw dislocation) or a stacking defect propagates from the stamp 2 in a crystal growth process, and the stamp 2 formed of the crystal defect is inherited in the grown SiC single crystal 3. Therefore, SiC single crystal 3 is put into a state where the defect inherited in the same shape as that of the stamp 2 is formed in the growth direction. Specifically, a pattern of the stamp 2 formed in the seed crystal 1 was formed through the SiC single crystal 3.

Even if the seed crystal 1 has any polymorphism or plane orientation, the crystal defect formed as described above is propagated as the through defect (the micropipe or the through screw dislocation) or the stacking defect. Accordingly, as described above, the polymorphism or the plane orientation of the seed crystal 1 is not particularly limited, and the crystal defect is inherited in the same shape as that of the stamp 2 even in any defects.

Figure 4:
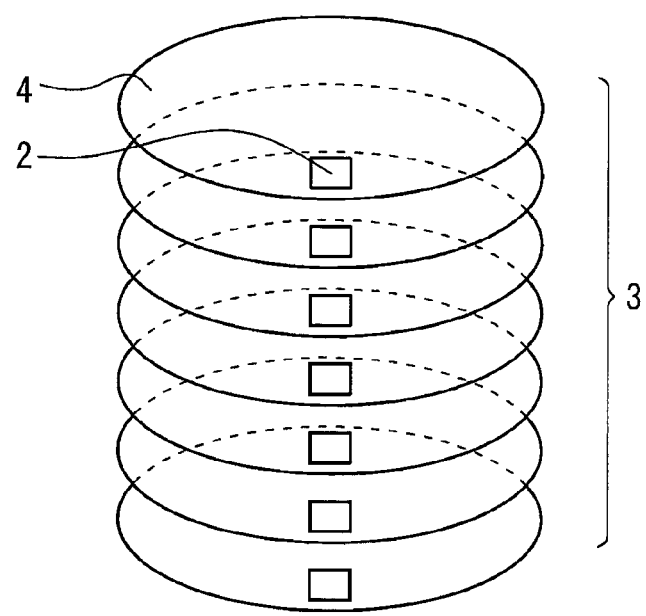
FIG. 4 is a diagram illustrating a state in which an SiC wafer is cut out from the SiC single crystal.

Thus, the stamp 2 penetrates through the SiC single crystal 3 grown on the surface of the seed crystal 1 to form the crystal defect having the same shape as that of the stamp 2. Accordingly, as illustrated in FIG. 4, even if the SiC single crystal 3 is cut out from the seed crystal 1, and then sliced into SiC wafers 4, the stamp 2 is formed in the respective SiC wafers 4. Therefore, even if the stamp 2 is not formed in the respective SiC wafers 4, the stamp 2 can be given during the growth of the SiC single crystal 3. Because the stamp 2 formed as described above is provided through an inside of the SiC single crystal 3, even if the SiC single crystal 3 is sliced into the SiC wafers 4, the stamp 2 does not disappear.

As described above, the stamp 2 is formed as the identification indication from the state of the seed crystal 1 in advance, and the stamp 2 is propagated to the SiC single crystal 3 as the crystal defect. Accordingly, when the SiC wafers 4 are formed with the use of the SiC single crystal 3, the stamp 2 has already been formed in the respective SiC wafers 4. In other words, when the SiC wafer 4 which is produced from the seed crystal 1 or the SiC single crystal 3 grown from the seed crystal 1 is obtained by unauthorized means such as theft, and SiC single crystal 3 is newly grown with the use of the seed crystal 1 and the SiC wafers 4, the stamp 2 can be formed in the SiC single crystal 3. Therefore, even if crystal growth is performed with the use of the high-quality seed crystal 1 or the SiC wafers 4, which have been obtained by the unauthorized means, as the seed crystal, to further manufacture the SiC wafer 4, it can be confirmed that the above seed crystal has been used for the SiC wafer 4.

Also, when the SiC single crystal 3 is formed with the SiC wafer 4 manufactured from the seed crystal 1, or the SiC single crystal 3 grown from the seed crystal 1 as the seed crystal, the stamp 2 is propagated in the growth direction of crystal, and the crystal defect having a structure to penetrate from the surface to the rear surface of the crystal is formed. Therefore, even in the state of the SiC single crystal 3, it can be confirmed that the seed crystal 1 or the SiC wafer 4 obtained by unauthorized means is used with the confirmation of the stamp 2.

In addition, the SiC wafer 4 which is manufactured by the manufacturing method according to the present embodiment is used in the production of an SiC semiconductor module with the SiC devices. Specifically, after an epitaxial layer is grown in an effective area of the SiC wafer 4, that is, a device formation region, various device formation processes such as an ion implantation process of impurities are implemented to form the SiC device. Then, after the formation of the device, the device is diced into chips, and then modularized to manufacture the SiC semiconductor module. In this case, in the present embodiment, as illustrated in FIG. 3, because only one stamp 2 is formed on the outer edge of the seed crystal 1, the stamp 2 can be formed with the avoidance of the effective region of the SiC wafer 4. Therefore, the location of the stamp 2 can be ensured without causing a restriction problem of the chip arrangement.

Second Embodiment

A second embodiment of the present disclosure will be described. In the present embodiment, the number of stamps 2 is changed as compared with the first embodiment, and other configurations are identical with those in the first embodiment. Therefore, only parts different from those in the first embodiment will be described.

Figure 5:
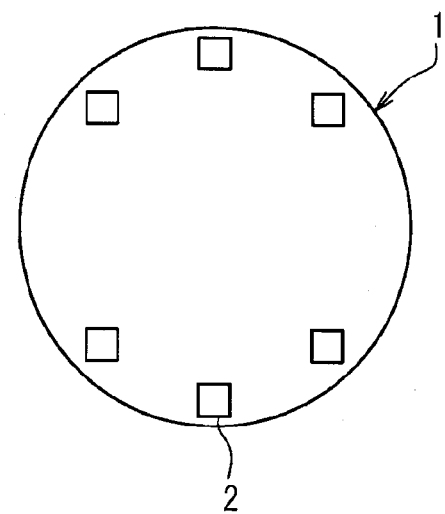
FIG. 5 is a diagram illustrating a location of the stamp in a seed crystal according to a second embodiment of the present disclosure.

As illustrated in FIG. 5, the stamps 2 are formed at plural positions in the outer edge of the seed crystal 1 in the present embodiment. For example, in FIG. 5, the stamps 2 are formed at six positions at approximately regular intervals, but the number of positions is equal to or smaller than six, or equal to or larger than six.

As in the first embodiment, when the stamp 2 is formed at only one position in the outer edge of the seed crystal 1, a region of the seed crystal 1 or the SiC wafer 4 with the avoidance of the stamp 2 remains with a relative large area. Accordingly, even if only a portion of the seed crystal 1 or the SiC wafer 4 illegally obtained is extracted with the avoidance of the stamp 2 to form a new seed crystal, there is a possibility that the seed crystal having a relatively large diameter can be produced. On the contrary, if the stamps 2 are formed on plural positions in the outer edge of the seed crystal 1 as in the present embodiment, a region of a portion of the seed crystal 1 or the SiC wafer 4 with the avoidance of the stamps 2 becomes relatively narrow. Therefore, even if only the portion of the seed crystal 1 or the SiC wafer 4 illegally obtained is extracted with the avoidance of the stamp 2 to form the new seed crystal, only the seed crystal having a relative small diameter is formed.

Third Embodiment

A third embodiment of the present disclosure will be described. Also, in the present embodiment, the number of stamps 2 in the first embodiment is changed. Other configurations are identical with those in the first embodiment, and therefore only parts different from those in the first embodiment will be described.

Figure 6:
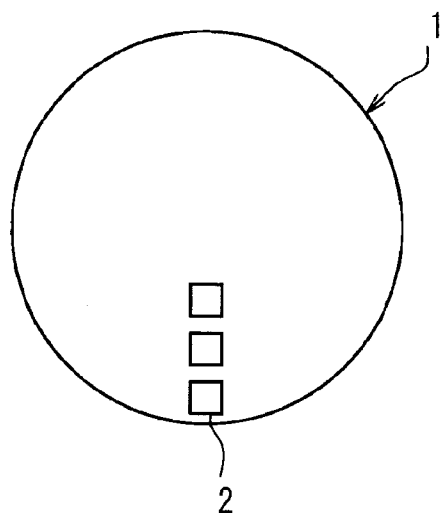
FIG. 6 is a diagram illustrating a location of the stamp in a seed crystal according to a third embodiment of the present disclosure.

As illustrated in FIG. 6, the stamps 2 are formed in line at plural positions from the outer edge toward a center of the seed crystal 1 in the present embodiment. For example, in FIG. 6, three stamps 2 are formed at approximately regular intervals, but the number of positions may be two, or equal to or larger than four.

Even if the stamps 2 are formed in line at the plural positions from the outer edge toward the center of the seed crystal 1, the same effects as those in the second embodiment can be obtained. However, when the stamps 2 are formed in this arrangement, since the stamps 2 have the potential to enter the effective area of the SiC wafer 4, there is a possibility that the chip placement is limited. Therefore, taking a fact that the chip arrangement is not limited, and only the seed crystal having the relatively small diameter is produced even if the seed crystal 1 or the SiC wafer 4 illegally obtained is used in consideration, it is most effective to form the stamps 2 in the arrangement of the second embodiment.

Fourth Embodiment

A fourth embodiment of the present disclosure will be described. Also, in the present embodiment, the number of stamps 2 in the first embodiment is changed. Other configurations are identical with those in the first embodiment, and therefore only parts different from those in the first embodiment will be described.

Figure 7:
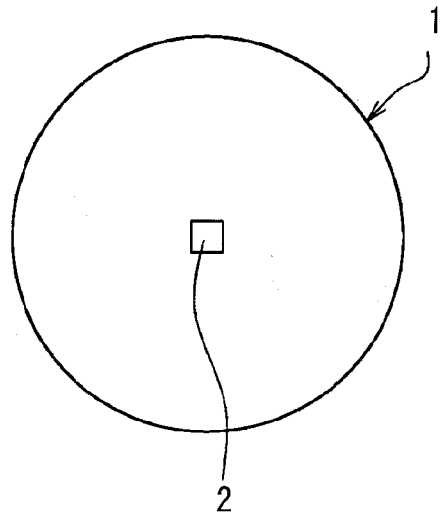
FIG. 7 is a diagram illustrating a location of the stamp in a seed crystal according to a fourth embodiment of the present disclosure.

As illustrated in FIG. 7, one or plural stamps 2 are formed in the center of the seed crystal 1 in the present embodiment. For example, in FIG. 7, only one stamp 2 is formed. However, two stamps 2 may be formed, or three or more stamps 2 may be formed.

In this way, even if the stamp 2 is formed in the center of the seed crystal 1, the same effects as those in the second embodiment can be obtained. However, when the stamps 2 are formed in this arrangement, since the stamps 2 have the potential to enter the effective area of the SiC wafer 4, there is a possibility that the chip placement is limited, as in the third embodiment. Accordingly, even taking the arrangement of the present embodiment into account, it is most effective to form the stamps 2 in the arrangement of the second embodiment.

Other Embodiments

In the above respective embodiments, various locations are exemplified as the locations of the stamps 2, but may be other locations different from those described in the above respective embodiments. Also, the stamps 2 may be formed by the combination of the locations described in the above respective embodiments.

Further, when the plural stamps 2 are formed, there is no need to configure all of the stamps 2 by the crystal defects of the same type, and the stamps 2 may be configured by the crystal defects different in type.

Since the stamps 2 propagate as the crystal defects having the same structure when the SiC single crystal 3 grows, there is no need to newly process the stamp 2. However, if the stamps 2 are unclear, the stamps 2 are processed so as to return to a clearer state.

The invention claimed is:

1. A silicon carbide single crystal formed using a silicon carbide semiconductor substrate as a seed crystal, the silicon carbide single crystal comprising:
    a crystal defect configured as a stamp that penetrates from a front surface to a rear surface of the silicon carbide single crystal, the stamp formed on at least a surface of the seed crystal as an identification indicator and propagated from the silicon carbide semiconductor substrate in a growth direction of the silicon carbide single crystal.

2. The silicon carbide single crystal according to claim 1, wherein
    the stamp is formed in one position or a plurality of positions of an outer edge.

3. The silicon carbide single crystal according to claim 1, wherein
    the stamp is formed of one or a combination of a letter, a number, a bar code, and a QR code which is a registered trademark.

4. A method of manufacturing a silicon carbide semiconductor substrate, comprising:
    preparing a seed crystal made of silicon carbide of a single crystal;
    forming a stamp on at least a surface of the seed crystal as an identification indication formed of a crystal defect;
    growing a silicon carbide single crystal while propagating the stamp in a growth direction, by growing the silicon carbide single crystal on the surface of the seed crystal on which the stamp is formed; and
    forming a silicon carbide semiconductor substrate formed with the stamp, by cutting out and slicing the silicon carbide single crystal to which the stamp is propagated.

5. The method of manufacturing the silicon carbide semiconductor substrate according to claim 4, wherein
    the forming the stamp includes forming the stamp by laser machining, cutting with a diamond cutting tool, dry etching, or ion implantation.

6. The method of manufacturing the silicon carbide semiconductor substrate according to claim 4, further comprising:
    growing the silicon carbide single crystal while propagating the stamp in the growth direction, by again growing the silicon carbide single crystal with the seed crystal after cutting out the silicon carbide single crystal or the silicon carbide semiconductor substrate as a seed crystal; and again forming the silicon carbide semiconductor substrate formed with the stamp by further cutting out and slicing the silicon carbide single crystal to which the stamp is propagated.

* * * * *